(12) United States Patent
Hirayama

(10) Patent No.: US 10,177,529 B2
(45) Date of Patent: Jan. 8, 2019

(54) OPTICAL TRANSMITTER PROVIDING COPLANAR LINE ON CARRIER

(71) Applicant: SUMITOMO ELECTRIC DEVICE INNOVATIONS, INC., Yokohama-shi (JP)

(72) Inventor: Masahiro Hirayama, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 2 days.

(21) Appl. No.: 15/496,548

(22) Filed: Apr. 25, 2017

(65) Prior Publication Data

US 2017/0310078 A1 Oct. 26, 2017

(30) Foreign Application Priority Data

Apr. 25, 2016 (JP) .................................. 2016-087091
Apr. 25, 2016 (JP) .................................. 2016-087092

(51) Int. Cl.
| | | |
|---|---|---|
| H04J 14/00 | (2006.01) |
| H01S 5/022 | (2006.01) |
| H01S 5/06 | (2006.01) |
| H01S 5/024 | (2006.01) |
| H04B 10/50 | (2013.01) |

(52) U.S. Cl.
CPC ...... *H01S 5/02236* (2013.01); *H01S 5/02276* (2013.01); *H01S 5/02415* (2013.01); *H01S 5/0601* (2013.01); *H04B 10/501* (2013.01)

(58) Field of Classification Search
CPC ............ G02B 6/12004; G02B 6/12019; G02B 6/1203; G02B 6/4201; G02B 6/4271; G02B 6/42

USPC .......................................................... 398/43
See application file for complete search history.

(56) References Cited

U.S. PATENT DOCUMENTS

| | | | |
|---|---|---|---|
| 6,437,899 B1 | 8/2002 | Noda | |
| 2004/0264835 A1* | 12/2004 | Matsushima | G02B 6/4201 385/14 |
| 2005/0213882 A1* | 9/2005 | Go | G02B 6/4201 385/37 |
| 2007/0053639 A1* | 3/2007 | Aruga | G02B 6/4201 385/94 |

(Continued)

FOREIGN PATENT DOCUMENTS

| | | |
|---|---|---|
| JP | 05-251939 A | 9/1993 |
| JP | 2001-209017 A | 8/2001 |
| JP | 2015-125153 A | 7/2015 |

*Primary Examiner* — Don N Vo
(74) *Attorney, Agent, or Firm* — Venable LLP; Michael A. Sartori; Tamatane J. Aga

(57) ABSTRACT

An optical module with a semiconductor element, which integrates a semiconductor laser diode with an electro-absorption modulator, mounted on a carrier; and an optical transmitter apparatus implementing the optical modules are disclosed. The carrier of the optical module has a back metal connected to the ground on the top thereof through a metal provided in a side surface of the carrier but electrically isolated from the chassis ground of the optical transmitter apparatus. The optical transmitter apparatus installs a plurality of the optical modules on a thermos-electric cooler (TEC) in a top plate thereof. The top plate is electrically isolated from the chassis ground.

20 Claims, 11 Drawing Sheets

(56) References Cited

U.S. PATENT DOCUMENTS

2008/0196929 A1\* 8/2008 Takamatsu ........... G02B 6/4201
  174/254
2012/0128290 A1\* 5/2012 Han ..................... G02B 6/4206
  385/14

\* cited by examiner

OPTICAL TRANSMITTER PROVIDING COPLANAR LINE ON CARRIER

CROSS REFERENCE TO RELATED APPLICATIONS

The present application claims the benefit of priority of Japanese Patent Applications No. 2016-087091 and No 2016-087092, both are filed on Apr. 25, 2016, which are incorporated herein by reference.

TECHNICAL FIELD

The present invention relates to an optical transmitter apparatus that provides a co-planar line on a carrier, in particular, the carrier with a back metal floated from chassis ground.

BACKGROUND

A transmission line type of the co-planar line has been well known for transmitting high frequency signals thereon. The co-planar line includes a signal line and ground lines or patterns sandwiching the signal line therebetween. When an additional ground metal is placed closer to the co-planar line, such an additional metal pattern possibly influences the transmission characteristic of the co-planar line, in particular, the transmission impedance thereof. Also, an apparatus implementing the co-planar line is requested to securely connect the ground lines to the ground.

SUMMARY

An aspect of the present invention relates to an optical transmitter apparatus that includes an optical module and a package that encloses the optical module therein. The package provides a chassis ground. The optical module includes a semiconductor element and a carrier that mounts the semiconductor element thereon. The semiconductor element of this aspect of the invention integrates a semiconductor laser diode (LD) with an electro-absorption modulator. The carrier has top and back surfaces and two sides opposite to each other. The top surface implements a co-planar line that includes a signal line and a ground metal having two portions sandwiching the signal line as leaving a preset gap therebetween. The signal line extends closer to one of the two sides. One of the portions of the ground metal, which is disposed apart from the one of the sides, mounts the semiconductor element thereon. A feature of the optical transmitter apparatus of this aspect of the invention is that the back surface of the carrier provides a float metal that is electrically connected to the ground metal on the top surface but electrically isolated from the chassis ground of the package.

Another aspect of the present invention also relates to an optical transmitter apparatus but having a plurality of lanes each outputting an optical signal, while, the optical transmitter apparatus outputs a multiplexed optical signal that multiplexes the optical signals. The optical transmitter apparatus of the present aspect includes a plurality of optical modules corresponding to the lanes, a thermo-electric cooler (TEC), and a package. Each of the optical modules includes a semiconductor laser element and a carrier. The semiconductor element integrates a semiconductor laser diode (LD) with an electro-absorption modulator. The carrier includes a top surface, a back surface and two sides opposite to each other. The top surface implements a co-planar line including a signal line and a ground metal having two portions sandwiching the signal line as leaving a preset gap therebetween. The signal line extends closer to the one of the sides. The ground metal in one of the portions thereof that is disposed apart from the one of the sides mounts the semiconductor element thereon. The TEC, which mounts the optical modules thereon, has a top plate made of electrically insulating material, where the top plate includes a metal pad that mounts optical modules thereon. The package encloses the semiconductor element and the optical module therein. The package provides a chassis ground. A feature of the optical transmitter apparatus of the present aspect is that the back surfaces of the carriers provide float metals electrically connected to the ground metals on the respective top surfaces thereof but electrically isolated from the chassis ground.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

Next, embodiment according to the present invention will be described as referring to accompanying drawings. The present invention is not restricted to the embodiment and has a scope defined in claims. The invention further includes any changes and modifications within a range equivalent to the scope of the claim. In the description of the drawings, numerals or symbols same with or similar to each other will refer to elements same with or similar to each other without duplicating the explanations.

Figure 1:
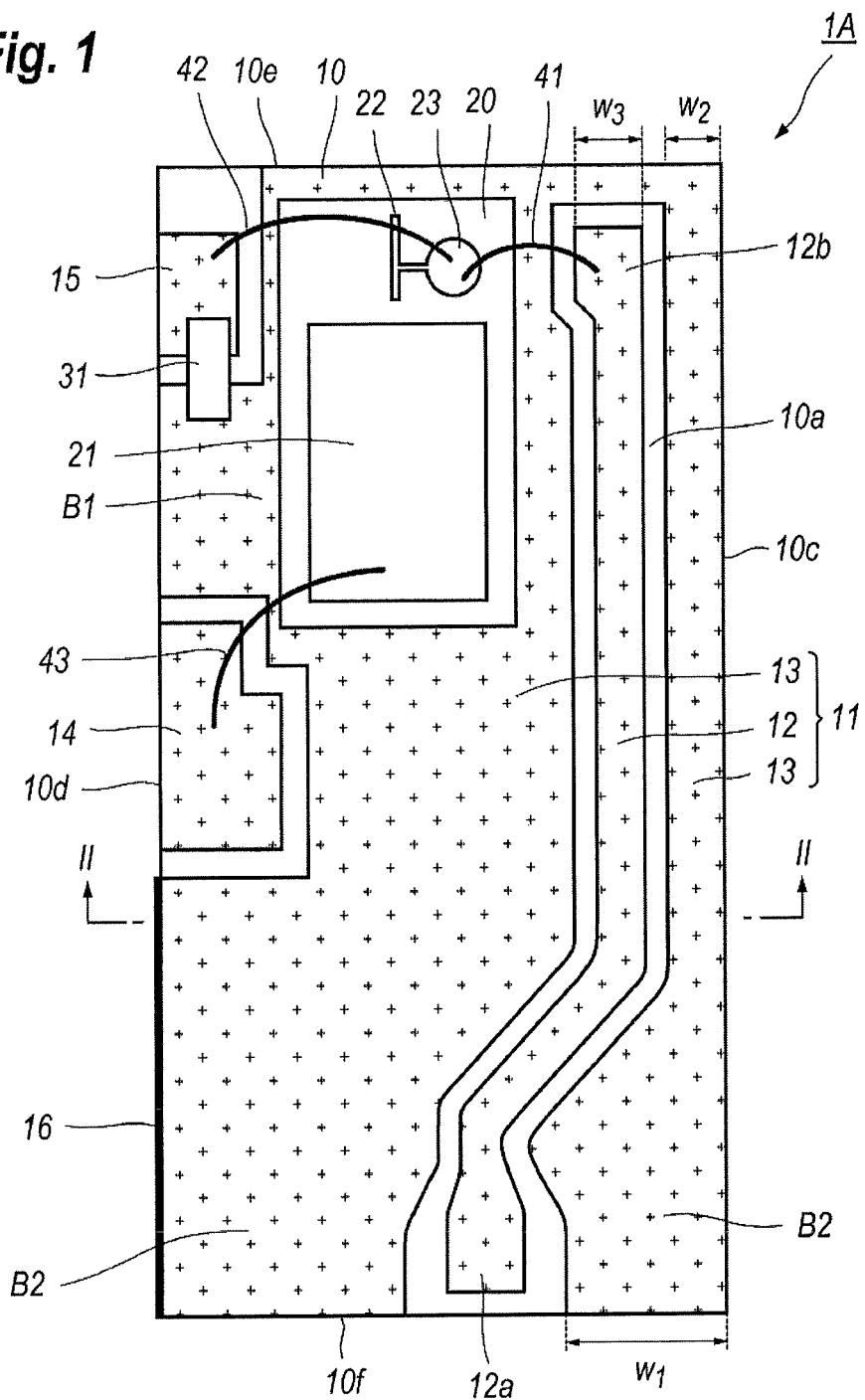
FIG. 1 is a plan view of an optical module installed within an optical transmitter apparatus according to one aspect of the present invention.
Figure 2:
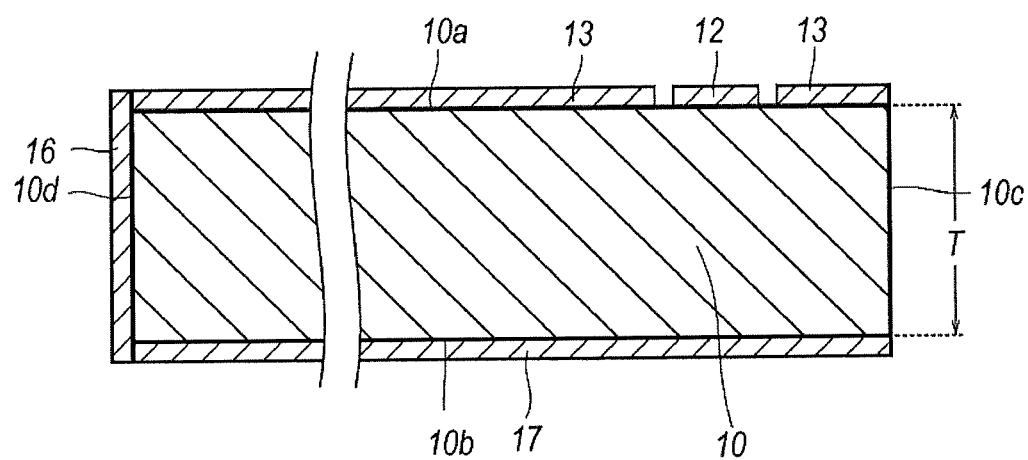
FIG. 2 shows a crass section taken along the line indicated in FIG. 1.

FIG. 1 is a plan view of an optical module 1A and FIG. 2 shows a cross section of the optical module 1A taken along a line II-II indicated in FIG. 1. The optical module 1A of the present embodiment, which may be implemented within an optical transmitter apparatus used in an optical communication system, includes a carrier 10, a co-planar line 11, a ground metal 13, a bias pad 14, a termination pad 15, a side metal 16, a back metal 17, and a semiconductor element 20. The semiconductor element 20 integrates a semiconductor laser diode (LD) monolithically with an optical modulator type of an electron-absorption (EA) on a substrate common to the LD and the EA. The semiconductor element provides an anode pad 21 through which the LD is provided with a bias current and a signal pad 23 connected to an anode pad 22 of the EA, where the EA is driven by a driving signal provided through the signal pad 23 and the anode pad 22. The anode pad 21 of the LD and the signal pad 23 may be formed by plated gold (Au).

The carrier 10, which has a rectangular slab shape made of electrically insulating material but having a substantial thermal conductivity, includes a top surface 10a, a back surface 10b, sides, 10c and 10d, opposite to each other, and other sides, 10e and 10f, also opposite to each other. The former two sides, 10c and 10d, longitudinally extend, white, the latter two sides, 10e and 10f, laterally extend and connect the former two sides, 10c and 10d. The carrier 10 mounts the semiconductor element 20 in a side closer to the side 10e of the top surface 10a. The carrier 10 may be made of, for instance, aluminum nitride (AlN) with a thickness T of greater than 0.3 mm. The carrier 10 of the present embodiment has the thickness of 0.4 mm.

The co-planar line 11 comprises a signal line 12 and the ground metal 13 putting the signal line 12 therebetween. The signal line 12, which may be a metal pattern, longitudinally extends from the side 10e to the other side 10f along the side 10c. The signal line 12 in one end thereof provides a pad 12a to which a bonding wire is to be bonded, while in the other end thereof closer to the side 10e also provides another pad 12b to which another bonding wire 41 extending to the signal pad 23 is bonded.

As described, the signal line 12 extends along the side 10c, which means that the signal line 12 and the semiconductor element 20 are arranged in side by side in an end closer to the side 10e. On the other hand, the signal line 12 is bent in an end closer to the side 10f, and the pad 12a is arranged in a center but slightly shift closer to the side 10c in the side 10f. Thus, the signal line 12 is arranged closer to the side 10c in a whole.

The ground metal 13, which are a metal pattern, extends in respective sides of the signal line 12 leaving a predetermined gap therebetween. The optical module 1A of the present embodiment provides the ground metal 13 on the whole top surface 10a of the carrier 10 except for areas surrounding the signal line 12, the bias pad 14, and the termination pad 15. The ground metal 13 in a portion closer to the side 10d provides an area B1 that mounts the semiconductor element 20 thereon such that the semiconductor element 20 in a back metal, which is a cathode electrode common to the LD and the EA, is physically and electrically connected to the ground metal 13. The ground metal 13 also provides areas B2 in respective sides of the signal line 12 in the side 10f, to which bonding wires 73 are wire-bonded, which will be described later.

The bias pad 14, which is a metal pattern, may be arranged in a longitudinal center close to the side 10d. A bonding wire 43 electrically connects the bias pad 14 to the anode pad 21. Also, another bonding wire connects the bias pad 14 to a lead terminal provided in a package within which the optical module 1A is enclosed, which will be illustrated in FIG. 3.

The termination pad 15, which is also a metal pattern isolated from the ground metal 13, is arranged in the side 10d and close to the side 10e. A bonding wire 42 electrically connects the termination pad 15 to the signal pad 23. Also, a terminator 31, which is a resistor chip, connects the termination pad 15 to the ground metal. That is, the signal pad 23 of the BA is terminated by the terminator 31 through the bonding wire 42 and the termination pad 15.

Referring to FIG. 2, the back metal 17 is provided in the back surface 10b in a whole of the carrier 10. The back metal 17 is only connected to the ground metal in the top surface 10a of the carrier but floated from a chassis ground of the package. That is, the optical module 1A shown in FIG. 1 is mounted on an electrically insulating plate provided on a thermo-electric cooler (TEC) 68 that provides a metal pattern reflecting dimensions of the back metal 17 of the carrier for mounting the carrier 10 thereon. Thus, the back metal 17 is floated from the chassis ground, and electrically connected only to the ground metal 13, which is the signal ground, on the top surface 10a of the carrier. Accordingly, the back metal 17 is sometimes called as a float metal in the present specification.

One reason why the carrier 10 provides the back metal 17 is that described above, that is, to bond the carrier 10 in the back surface thereof 10b onto the metal pattern provided in the electrically insulating top plate of the TEC. Another reason why the carrier 10 provides the back metal 17 is for testing the semiconductor element 20 during an assembly of the optical module 1A. That is, in advance to install the optical module 1A within the package, electrical tests of the LD and EA are carried out by probing the signal line 12 between the end pad 12a and the ground metal 13, and between the bias pad 14 and the ground metal 13. Specifically, static characteristic of the LD is investigated by supplying a DC bias between the bias pad 14 and the ground metal 13 as supplying a DC or a low frequency signal between the end pad 12a of the signal line 12 and the ground metal 13. Also, dynamic characteristic of the PA is tested by supplying a high frequency signal between the end pad 12a and the ground metal 13 as supplying a DC bias between the bias pad 14 and the ground metal 13. Thus, complex probing is required for the test during the assembly of the optical module 1A. Placing the carrier 10 with the back metal 17 on an electrically conductive substrate during the test, the probing to the ground metal 13 may be replaced to probe the electrically conductive substrate by connecting the back metal 17 to the ground metal 13 by the side metal 16. Thus, the intermediate test during the assembly may be simplified. However, the back metal 17 possibly changes propagation characteristics of the driving signal carried on the signal line 12 when the back metal 17 is electrically connected to the chassis ground. Also, noises externally entering the package possibly influence the driving signal on the signal line 12 through the chassis ground, the back metal 17 and the ground metal 13. Thus, the back metal 17 is preferably isolated from the chassis ground.

The side metal 16 is provided only in the side 10d of the carrier in a portion closer to the side 10f. That is, the side 10d removes the side metal 16 in a portion closer to the side 10e. Because the side metal 16 is apart from the signal line 12, the side metal 16 causes no influence of the transmission of the driving signal carried on the signal line 12.

The signal line 12, the ground metal 13, the bias pad 14, the termination pad 15, the side metal 16, and the back metal 17 may be made of plated gold (Au) accompanying with a titanium (Ti) layer, a platinum (Pt) layer, and another gold (Au) layer as seed layers for the metal plating. Where the Ti layer, the Pt layer, and the Au layer have thicknesses of 0.1 µm, 0.2 µm, and 3 µm, respectively.

Figure 3:
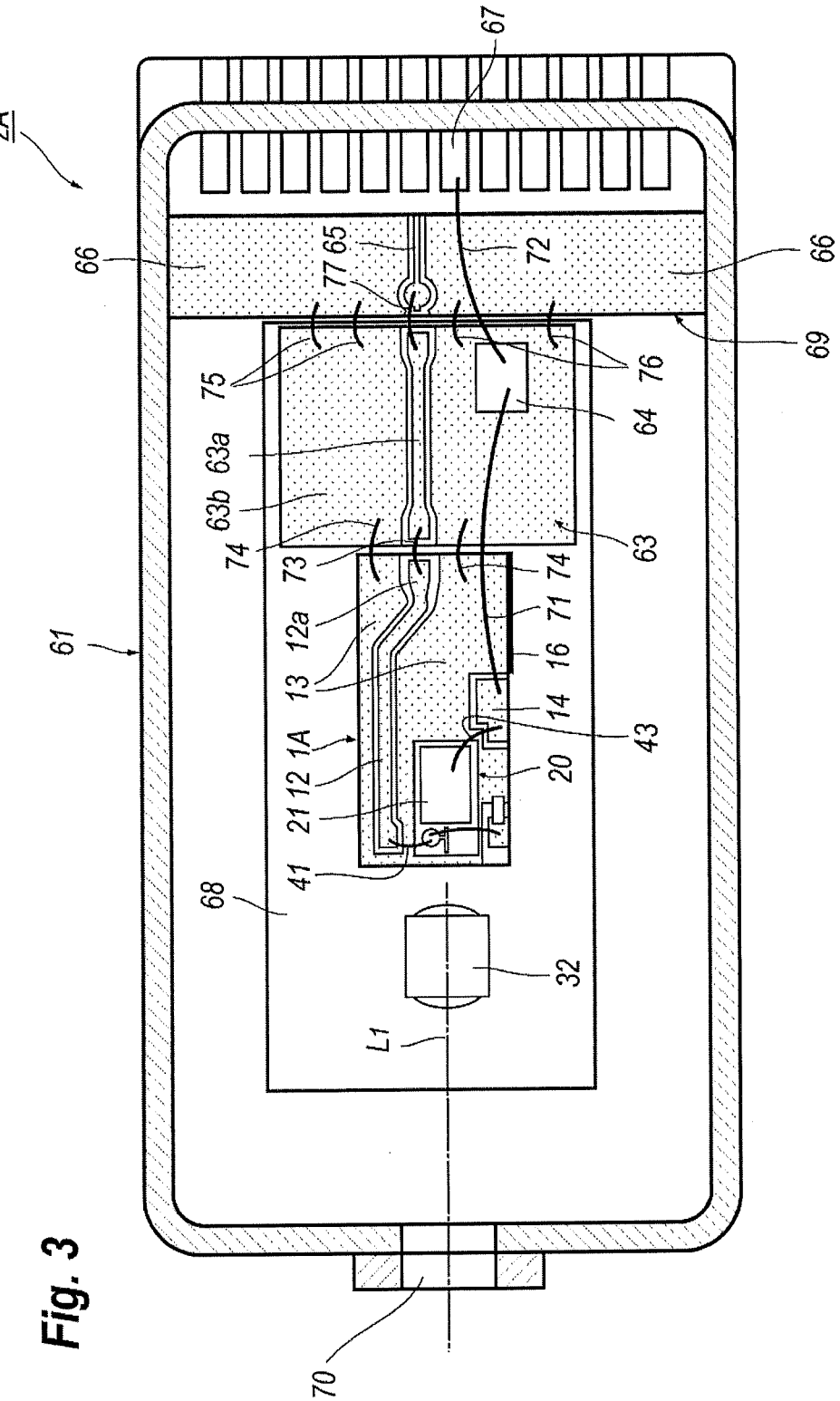
FIG. 3 is a plan view of the optical transmitter apparatus of the first embodiment of the present invention, where the optical transmitter apparatus provides the optical module shown in FIG. 1.

FIG. 3 shows a plan view of an optical transmitter apparatus 2A that implements the optical module 1A therein. The optical transmitter apparatus 2A includes, in addition to the optical module 1A, a package 61, a lens 32, a wiring substrate 63, and a thermoelectric cooler 68 therein. The package 61, which has a box shape, encloses the optical module 1A, the lens 32, the wiring substrate 63, and the TEC 68 air-tightly. The package 61 provides a feedthrough 69 and lead terminals 67 in a rear thereof. The feedthrough 69 provides another co-planar line also comprised of a signal line 65 and ground metal 66 sandwiching the signal line therebetween. The lead terminals 67 are formed on a ceramic layer extending from an interior to an exterior of the package 61. Although FIG. 3 only illustrates a top surface of the ceramic layer, the ceramic layer provides other lead terminals connected to the signal line 65 in a back surface thereof, which also extends from the interior to the exterior of the package 61.

The lens 32, which is also mounted on the TEC 68, optically couples with an output facet of the semiconductor element 20. The lens 32 collimates light L1 emitted from the semiconductor element 20. The collimated light L1 is externally output from the package 61 through a window 70 provided in a front side of the package 61.

The wiring substrate 63, which is arranged between the feedthrough 69 and the optical module 1A and mounted on the TEC 68, provides a co-planar line comprising a signal line 63a and ground metal 63b sandwiching the signal line 63a therebetween. One end of the signal line 63a is wire-bonded to the end pad 12a of the signal line 12 on the carrier 10 by a bonding wire 73, while, the other end of the signal line 63a is wire-bonded to the signal line 65 on the feedthrough 69 by a bonding wire 77. Thus, the driving signal may be provided to, the signal pad 23 of the EA through one of the lead terminal 67, the signal line 65 of the feedthrough 69, the bonding wire 77, the signal line 63a on the wiring substrate 63, the bonding wire 73, the signal line 12 on the carrier 10, and the bonding wire 41.

The ground metal 63b is formed in the respective sides of the signal line 63a as leaving a predetermined gap therebetween and wire-bonded to the ground metal 13 on the carrier 10 with bonding wires 74. Also, other ends of the ground metal 63b is wire-bonded to the ground metal 66 on the feedthrough 69 with bonding wires, 75 and 76, and the ground metal. 66 on the feedthrough 69 is electrically and externally connected to the signal ground of a system where the optical transmitter apparatus 2A is implemented therein.

The ground metal 63b on the wiring substrate 63 mounts a capacitor 64 of a type of a die-capacitor with a bottom electrode facing and in contact to the ground metal 63b, while, a top electrode thereof is wire-bonded to the lead terminal 67 with a bonding wire 72 and to the bias pad 14 on the carrier 10 with another bonding wire 71. The lead terminal 67 receives a DC bias and this DC bias is supplied to the semiconductor element 20, in particular, to the anode pad 21 of the LD through the bonding wire 72, the bypassing capacitor 64, the bonding wire 71, the bias pad 14 and the bonding wire 43.

Preferable features of the optical module 1A will be described. The optical module 1A of the embodiment provides the carrier 10 whose back surface 10b is coated with the back metal 17. The back metal 17 is only for testing the optical module 1A during the assembly thereof and electrically connected to nowhere except for the ground metal 13 on the top surface 10a of the carrier after the completion of the assembly. The back metal 17 is electrically connected to the ground metal 13 on the top surface 10a through the side metal 16. The back metal 17 is physically connected to the top plate of the TEC 68 made of electrically insulating material. Thus, the back metal 17 causes no influence for the electrical transmission of the driving signal on the signal line 12. In other word, the signal line 12 may be the co-planar line combined only with the ground metal 13 provided in the respective sides thereof as leaving the gap therebetween. The back, metal 17 is useful for the test during the assembly of the optical transmitter apparatus 2A. That is, the optical module 1A, in particular, the semiconductor element 20, is necessary to be tested in the static characteristic in the LD and the EA, namely, the I-L characteristic of the LD and the extinction ratio of the EA, and the temperature dependence thereof; and the dynamic characteristic of the EA, namely, the frequency dependence of the extinction ratio of the EA. During the test, the optical module 1A is mounted on a stage of the testing apparatus and probing the bias pad 14 and the stage for the test of the LD and the end pad 12a of the signal line 12 and the stage for the EA, the test procedures may be simplified and the test may be accelerated.

The side metal 16 of the embodiment may electrically connect the back metal 17 to the ground metal 13. The carrier 10 provides the side metal 16 only in the side 10d apart enough from the signal line 12 compared with the thickness T of the carrier 10. Thus, the back metal 17 may be electrically connected to the ground metal 13 without influencing the signal transmission on the signal line 12, in particular, the high frequency performance of the driving signal carried on the signal line 12.

The carrier 10 has the thickness T preferably greater than 0.3 mm, where the present embodiment of the carrier 10 has the thickness of 0.4 mm. Thus, the back metal 17 may be set apart from the signal line at least 0.3 mm. Accordingly, the back metal 17 causes no influence for the co-planar arrangement of the signal line 12 and the top ground metal 13. Because the carrier 10 of the embodiment is made of aluminum nitride (AlN), the back metal 17 possibly causes or degrades the co-planar characteristic on the top surface 10a when the thickness T of the carrier becomes less than 0.15 mm. Thus, the carrier 10 with the thickness T greater than 0.3 mm, the back metal 17 may cause substantially no influence on the transmission of the driving signal on the signal line 12.

[First Modification]

Figure 4:
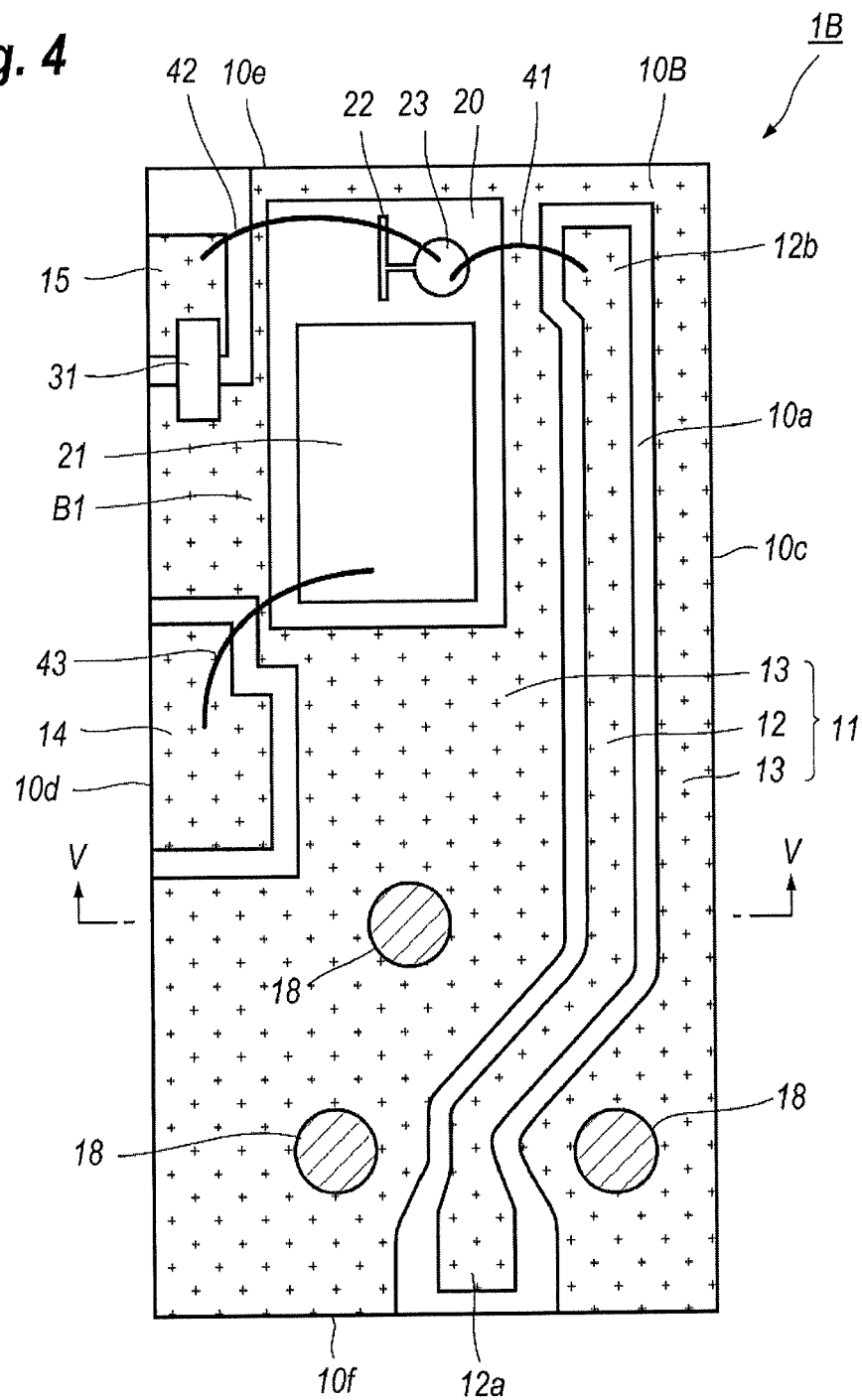
FIG. 4 is a plan view of another optical module modified from that shown in FIG. 1.
Figure 5:
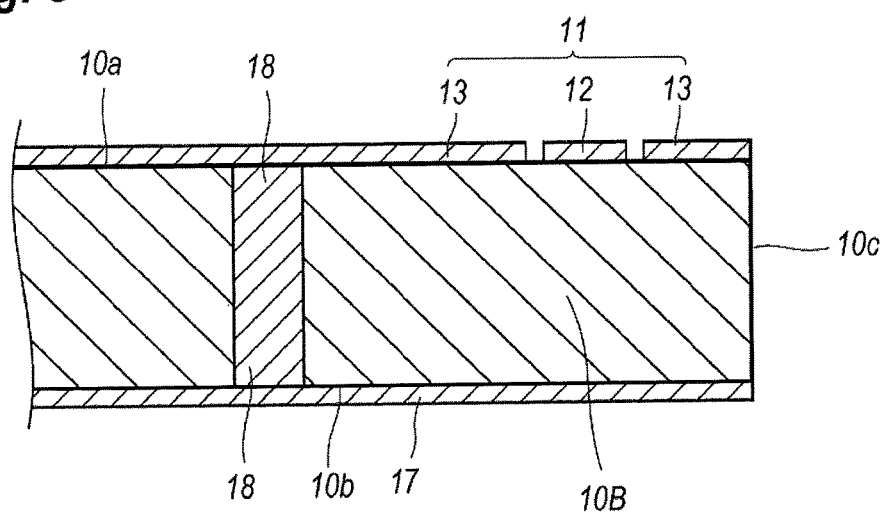
FIG. 5 shows a cross section of the modified optical module, which is taken along the line V-V in FIG. 4.

FIGS. 4 and 5 show a plan view of the optical module 1B and a cross section thereof taken along the line V-V indicated in FIG. 4, respectively. The optical module 1B, in particular, the carrier 10B provides, instead of the side metal 16 in the aforementioned embodiment, vias 18 in respective sides of the signal line 12 and in an area for wire-bonding to the wiring substrate 63. The vias 18 are filled with a metal to secure electrical conductivity thereof. Although the carrier 10B in FIG. 4 provides only three vias 18, the carrier 10B may provide four or more vias to securely connect the back metal 17 to the top ground 13.

[Second Modification]

Figure 6:
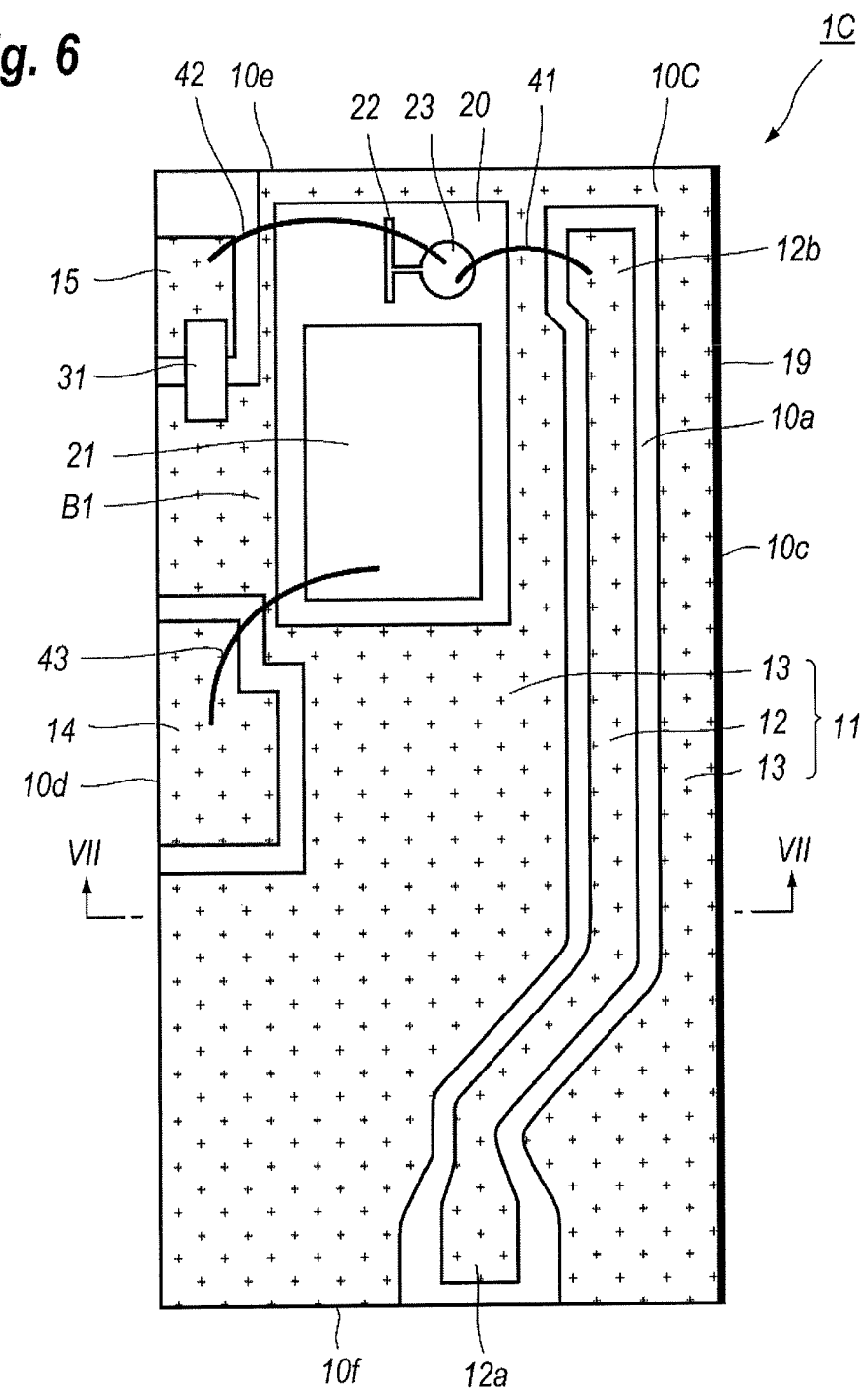
FIG. 6 is a plan view of another optical module still modified from that shown in FIG. 1.
Figure 7:
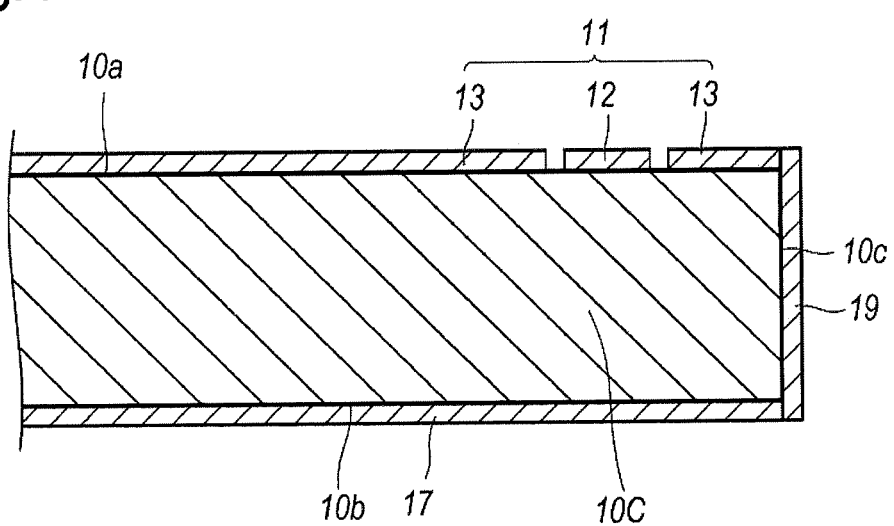
FIG. 7 shows a cross section of the modified optical module, which is taken along the line VII-VII appearing in FIG. 6.

FIGS. 6 and 7 show a plan view of the optical module 1C and a cross section thereof taken along the line VII-VII appearing in FIG. 6, respectively. The optical module 1C shown in FIGS. 6 and 7, in particular, the carrier 10C provides a side metal 19 in a whole of the side 10c from the side 10e to the other side 10f, where the side 10c is closer to the co-planar arrangement 11 different from the arrangement of the carrier 10 shown in FIG. 1. As described, when a metal pattern, in particular, a metal pattern connected to the ground metal 13 positions closer to the signal line 12 of the co-planar arrangement, the co-planar line 11 possibly degrades the transmission characteristic thereof such as S-parameters, namely, varies the transmission impedance thereof from designed impedance. Accordingly, taking the thickness T of the carrier 10C, a distance from the signal line 12 to the side metal 19 is greater than the predetermined gap left between the signal line 12 and the ground metal 13.

Although not shown in figures, the sides 10e and/or 10f, may also provide a side metal electrically connecting the back metal 17 to the ground 13. Similar to the previous modifications, a distance from the signal line 12 to the side metal provided in the sides, 10e and/or 10f, is greater than the predetermined gap between the signal line 12 and the ground metal 13.

Figure 8A:
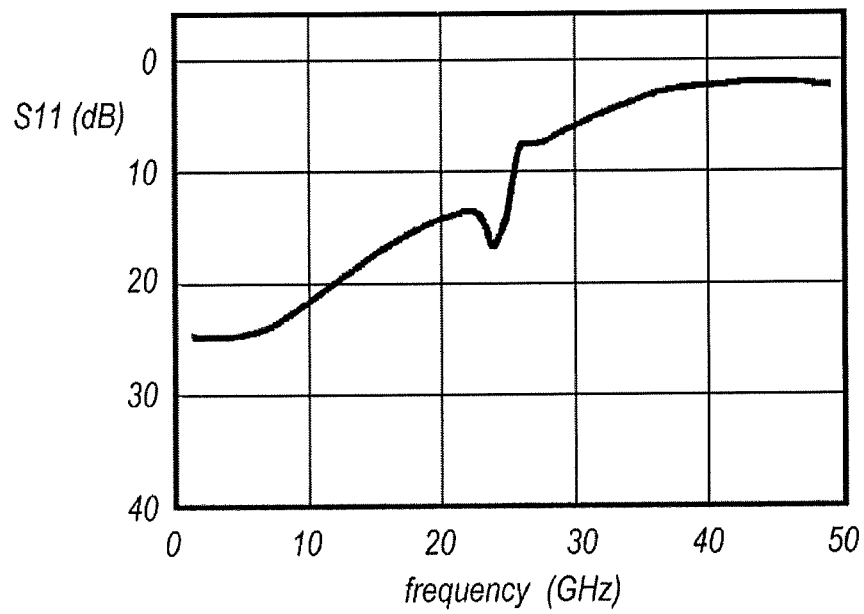
FIG. 8A shows reflection performance of the modified optical module shown in FIG. 6.
Figure 8B:
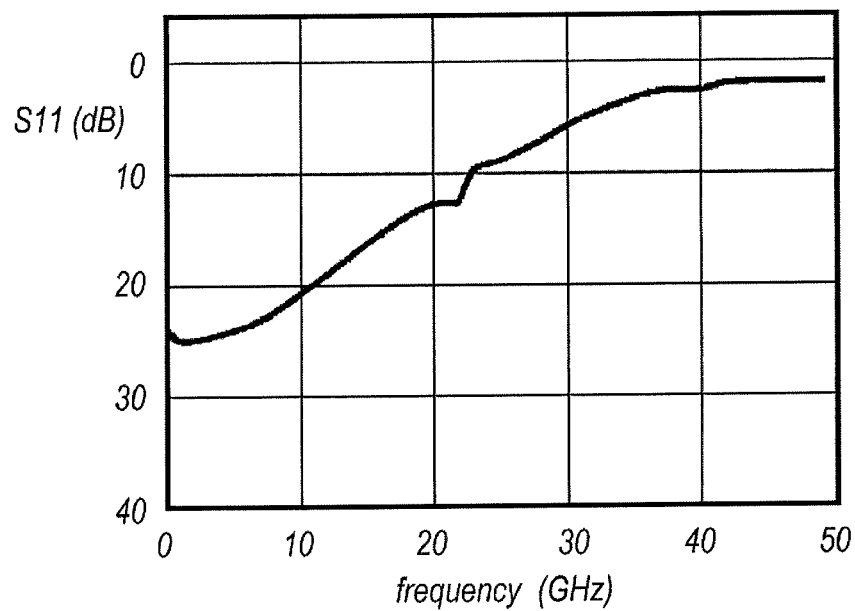
FIG. 8B shows reflection performance of the optical module of the first embodiment shown in FIG. 1.

FIG. 8A and FIG. 8B compare the transmission impedance of the co-planar line 11 of the first embodiment shown in FIG. 1 and that of the second modification shown in FIG. 6. That is, FIGS. 8A and 8B compare the influence of the side metals, 16 and 19, provided apart from the signal line 12 (FIG. 8B) and closer to the signal line 12 (FIG. 8A), respectively. In a practical operation of the optical modules, 1A and 1C, the S-parameter S11 is requested to be not only low enough, which means that the transmission impedance of the co-planar line 11 becomes equal to the designed characteristic impedance, but smooth enough in an operating frequency range. As FIGS. 8A and 8B indicate, the signal reflection S11 causes a substantial dip in frequencies around 25 GHz, which is a high end of the operating frequency range for the optical modules, 1A and 1B. However, the dip in the signal reflection S11 means that, although the smoothness thereof is slightly sacrificed, the characteristic impedance of the co-planar line 11 becomes closer to the designed one. Moreover, the amount of the dip is within an acceptable range for the practical operation of the optical module 1C. This means that, although the side metal 19 provided in the side 10c closer to the co-planar line 11, the side metal 19 is apart therefrom by at least 0.15 mm that is the designed minimum gap between the signal line 12 and a metal pattern except for the ground metal 13. Thus, the carrier 10 of the embodiment may provide a side metal in the side 10f and in the other side 10e as long as the gap with a minimum distance at least 0.15 mm is secured against the signal line 12.

Second Embodiment

Figure 9:
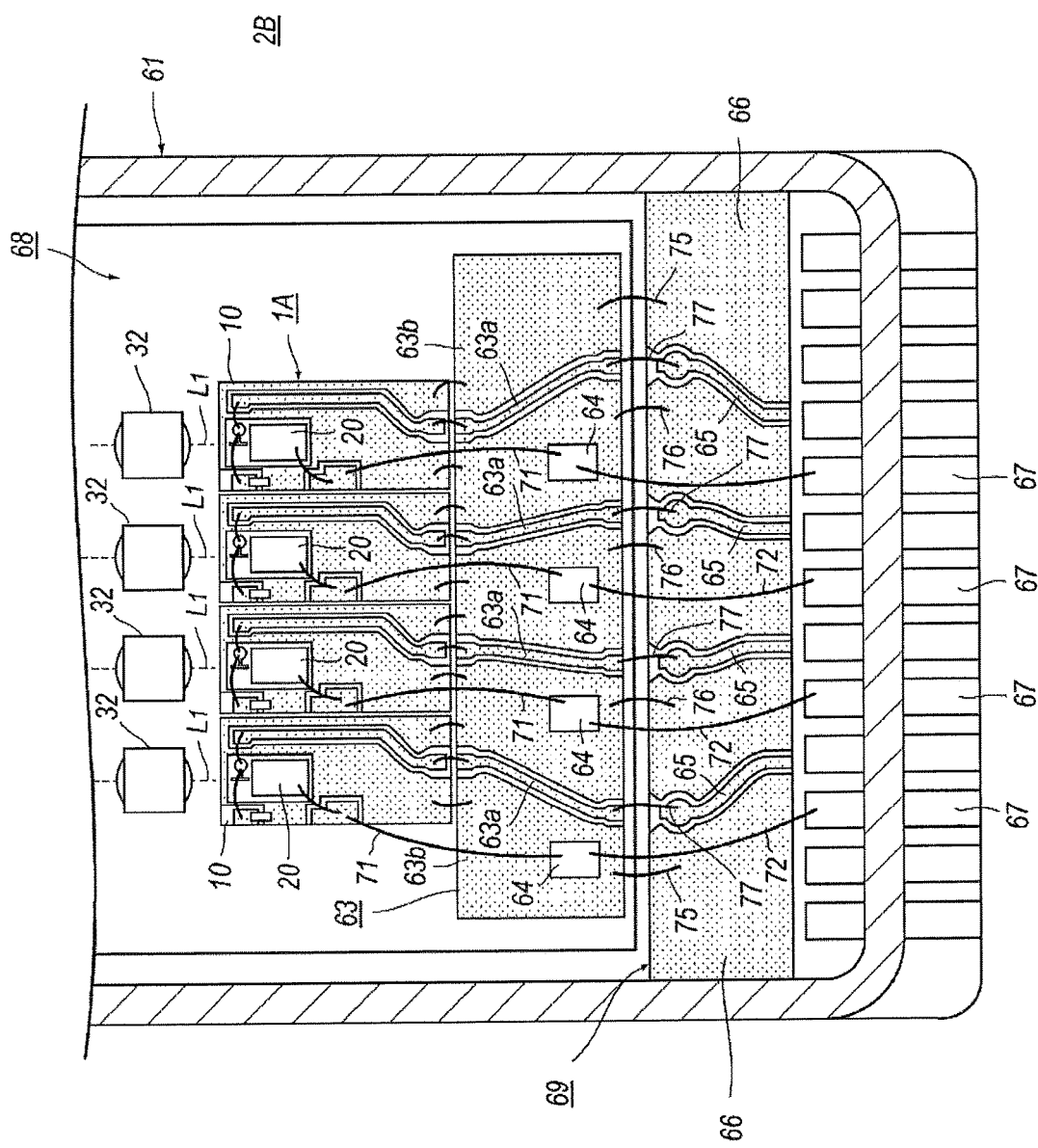
FIG. 9 is a plan view of another optical transmitter apparatus according to the second embodiment of the present invention.

FIG. 9 shows a plan view of an optical transmitter apparatus 2B according to the second embodiment of the present invention. The optical transmitter apparatus 2B implements four optical modules 1A and four lenses 32 within the package 61, where a unit of one optical module 1A including one semiconductor element 20 and one lens 32 constitute one lane of the optical transmitter apparatus 2B. Each of the lanes is independently driven by a driving signal supplied from the outside of the package 61 through the co-planar lines. Although FIG. 9 explicitly shows that optical modules installed within the optical transmitter apparatus 2B are the type of the first embodiment 1A shown in FIG. 1, other types of the optical module, 1B and 1C, may be implemented within the optical transmitter apparatus 2B. The rear end of the package 61 opposite to those installing the lenses 32 provides lead terminals 67 through which the driving signals for the respective lanes are provided. The lead terminals 67 appearing in FIG. 9 are grouped in two types, one of which are for providing the driving signals while others secure the ground, where they are alternately disposed to each other. The lead terminals involved within the former group continue to the signal lines 65 on the feedthrough 69 and those within the latter group continue to the ground metal 66 also provided on the feedthrough 69. The signal lines 65 are wire-bonded to the signal lines 63a on the wiring substrate 63. Similar to the first embodiment shown in FIG. 3, the wiring substrate 63, the optical modules 1A and the lenses 32 are mounted on the top plate of the TEC 68, where the top plate is made of electrically insulating material.

Figure 10:
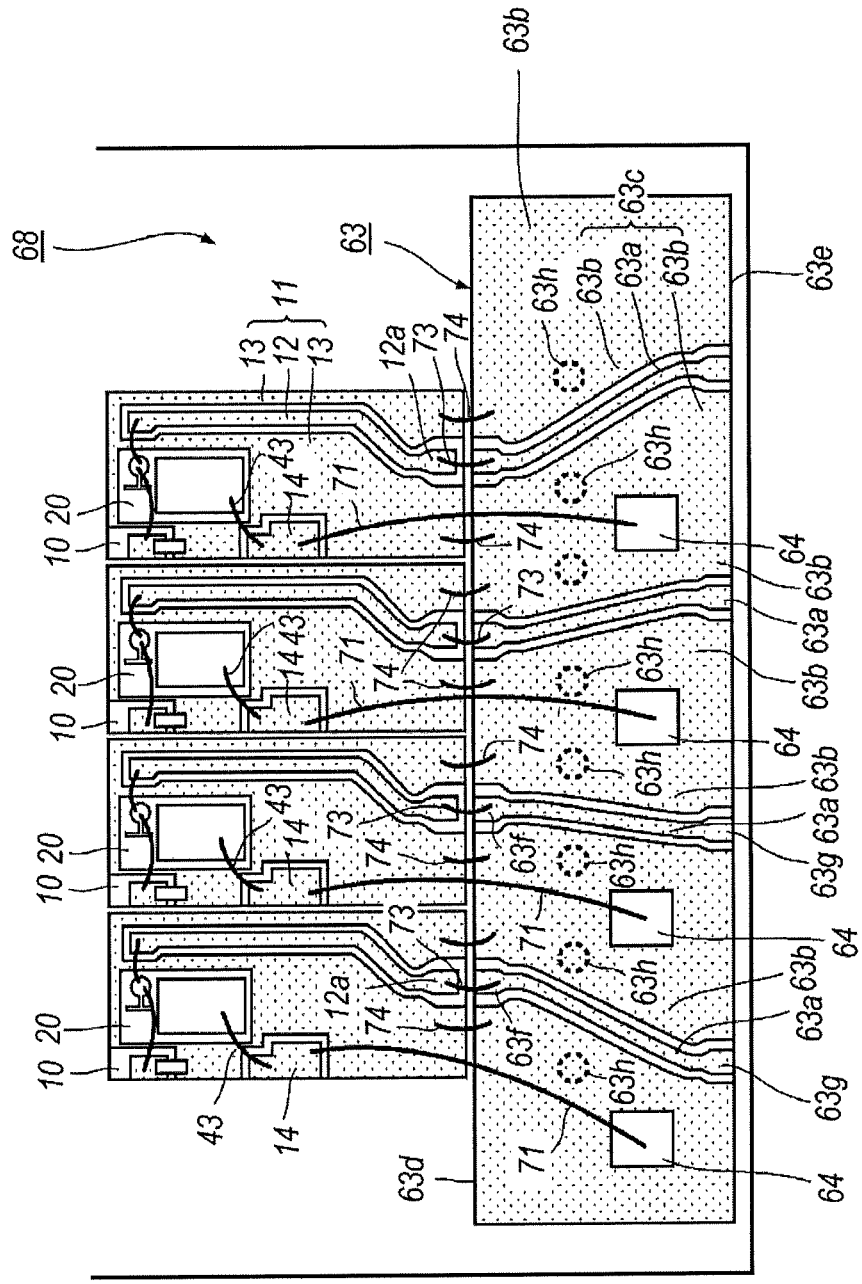
FIG. 10 magnifies a primary portion of the optical transmitter apparatus of the second embodiment.

FIG. 10 magnifies a primary portion of the optical transmitter apparatus 2B, that is, the arrangement on the wiring substrate 63 and four optical modules 1A mounted on the TEC 68. The wiring substrate 63 provides four co-planar lines, that is, four signal lines 63a and the ground metal 63b between the signal lines 63a leaving the gap of the predetermined distance therebetween. The signal lines 63a in one ends 63e are wire-bonded to the signal lines 65 on the feedthrough 69 by bonding wires 77. Also, the ground metals 63b are wire-bonded to the ground metals 66 on the feedthrough 69 by bonding wires, 75 and 76. The ground metals 66 on the feedthrough 69 are connected to the signal ground provided outside of the package 61 but isolated from the chassis ground of the package 61.

The wiring substrate 63 also mounts on the ground metal 63b four capacitors 64 that correspond to the respective lanes. The capacitors 64 are the type of a die-capacitor having a top electrode and a bottom electrode. The bottom electrode faces and in contact to the ground metal 63b, while, the top electrode is wire-bonded to the lead terminals 67 with bonding wires 72, where the terminals 67 supply the DC biases, and also to the bias pads 14 on the optical modules 1A with bonding wires 71.

The optical modules 1A each has an arrangement shown in FIG. 1, that is, the optical modules 1A each has the lateral width smaller than 1 mm, the present embodiment has the lateral with of 0.7 mm, and the longitudinal length of about 2 mm. Four optical modules 1A are arranged in side by side such that a total lateral width thereof is within about 3 mm, which means that a gap about 0.07 mm is secured therebetween. Each of the optical modules 1A provides the carrier 10 with the top surface 10a and the back surface 10b. The back surface 10h accompanies with the back metal 17, while, the top surface 10a provides the ground metal 13 and the signal line 12 that form the co-planar line 11. The ground metal 13 mounts the semiconductor element 20 thereon. The top surface 10a also provides the bias pad 14 and the termination pad 15. As already described in FIG. 1, the co-planar line 11 and the semiconductor element 20 are disposed in side by side in the side 10e facing the lens 32, while, the co-planar line 11 is disposed in a center portion in the side 10f facing the wiring substrate 63.

The semiconductor element 20 of the present embodiment integrates the LD with the EA, where the LD emits the continuous wave (CW) light while the EA modulates this CW light. Thus, the semiconductor element 20 may output the modulated light to the lens 32. The lens 32 may collimate the modulated light that is dispersive from the semiconductor element 20. Although not illustrated in FIGS. 9 and 10, the optical transmitter apparatus 2B provides an optical coupling system that multiplexes the four collimated light output from the lenses 32 into one multiplexed light. The multiplexed light is output from the package 61 passing through the window 70 in the front wall of the package 61.

The co-planar line 11 carries the driving signal thereon to the semiconductor element 20, specifically, to the signal pad 23 of the EA in the semiconductor element 20. As described, the co-planar line 11 in one end 12a thereof locates in a center portion in the side 10f facing the wiring substrate 63, exactly, in the center portion but slightly closer to the side 10c, while the co-planar line 11 in the other end 12b thereof and the semiconductor elements 20 are arranged in side by side in the side 10e facing the lens 32. Accordingly, the signal line 12 of the co-planar line 11 runs along the side 10c of the carrier 10 as a whole. The signal line from the co-planar line 11 to the termination resistor 31 crosses the semiconductor element 20 in the side of the EA thereof through two bonding wires, 41 and 42. The driving signal in the present embodiment has the speed of, for instance, 28 Gb/s. Because the bonding wires, 41 and 42, extend in perpendicular to the signal line 12 provided in the neighbor optical modules, the crosstalk between the bonding wires, 41 and 42, and the neighbor signal lines 12 may be suppressed. The present optical transmitter apparatus 2B arranges the optical modules 1A in side by side with an extremely limited spaces therebetween; accordingly, arrangements of the optical modules, 1A may suppress the crosstalk between the lanes is inevitable.

The optical modules 1A of the embodiment will be further described. In the optical module 1A, one portion of the ground metal 13 closer to the side 10c has a width narrower than a width of the other portion of the ground metal 13 in the side of the bias pad 14 and the terminator pad 15. The narrower ground metal 13 preferably extends more than a half of the side 10c. Also, the narrower ground metal 13 closer to the sides 10c has an average width thereof that is narrower than an average width of the ground metal 13 disposed in the opposite side. As FIG. 1 illustrates, the signal line 12 is bent toward the center portion in the side closer to the side 10f of the carrier 10. That is, the signal line 12 becomes gradually apart from the side 10c as close to the side 10f. Accordingly, the narrower ground metal 13 has a width $w_1$ at the side 10f that is wider than a width $w_2$ thereof at the side 10e; but the width $w_2$ of the narrower ground metal 13 is wider than a width $w_3$ of the signal line. A co-planar line generally has a ground metal in respective sides of the signal line have widths wider enough compared to a width of the signal line. The arrangement of the co-planar line of the present embodiment, opposite to the conventional arrangement for the co-planar line, has the signal line whose width is wider than that of the ground line. The signal line 12 of the embodiment has the width $w_3$ of, for instance, smaller than 1/10 of the lateral width of the optical module 1A, where the present embodiment provides the signal line 12 with the width about 70 μm and that of the narrower ground line 13 at the side 10e has a width of 10 to 70 μm. This arrangement of the narrower ground metal 13 may be effective for reducing the crosstalk affected from an optical module arranged in the neighbor to the side 10c in addition to the positional relation between the bonding wires, 41 and 42, and the signal line 12, which makes a substantially right angle therebetween. The signal pattern 12, the ground metal 13, and two pads, 14 and 15, may be made of plated gold (Au), exactly, a stacked seed metals of titanium (Ti), platinum (Pt), and gold (Au), and the plated gold (Au) thereof, with thicknesses of 0.1 μm, 0.2 μm, and 3 μm, respectively.

Referring to FIG. 10 again, four bonding wires 71 connect the capacitors 64 to the bias pads 14 in order to provide the DC biases to the LDs in the semiconductor elements 20. The wiring substrate 63, as already described, provides four co-planar structures 63c constituted by the signal lines 63a and the ground metal 63b sandwiching the signal lines 63a therebetween. The wiring substrate 63 has a rectangular shape with a lateral width of 3.5 mm and a longitudinal length of 1.0 mm. The wiring substrate 63 also has a side 63d facing the optical modules 1A and another side 63e facing the feedthrough 69. The ground metal 63b mounts the de-coupling capacitors 64 thereon. The de-coupling capacitors 64 and the co-planar structures 63c are laterally and alternately arranged in side by side on the wiring substrate 63.

The signal lines 63a have a pitch substantially equal to a pitch of the optical modules 1A in the side 63d thereof, while, another pitch in the side 63e substantially equal to a pitch of the lead terminals 67 in the first group that carry the driving signals. The former pitch is smaller than the latter, that is, the wiring substrate 63 may show a function of the pitch-conversion.

The signal lines 63a provide pads 63f in one ends facing the optical modules 1A, while, other pads 63g in other ends facing the feedthrough 69. The former pads 63f are wire-bonded to the pads 12a in the optical modules 1A with the bonding wires 73, while, the latter pads 63g are wire-bonded to the signal lines 65 on the feedthrough 69 with bonding wires 77. The pads, 63f and 63g, extend in the edges of the respective sides, 63d and 63e, which means that the four ground metals 63b are isolated in the top surface 63c of the wiring substrate 63. However, the wiring substrate 63, similar to the optical modules 1A, provides a back metal in a back surface thereof; and each of the ground metals 63b provides vias 63h that electrically connect the ground metals 63b on the top surface to the back metal on the back surface of the wiring substrate. Thus, the ground metals 63b are electrically connected to each other. Also, the wiring substrate 63 is mounted on the top plate of the TEC, which may be made of electrically insulating materials but provides a metal pad that is electrically isolated from the chassis ground. Thus, the signal lines 63a, or the driving signals carried on the signal lines 63a, have the ground common to all lanes but isolated from the chassis ground or the housing 61.

Next, advantageous of the optical transmitter apparatus 2B of the embodiment will be described. As FIG. 1 and others illustrate, the optical modules, 1A to 1C, of the present invention arranges the co-planar lines 11 closer to the side 10c of the carriers 10 not a center thereof. Moreover, the carrier 10 provides the metal in the side 10c, or the side 10d in the optical module 1A arranged neighbor thereto, that connects the back metal 17 to the ground metal 13 on the top surface 10a of the carrier 10, the crosstalk, or the noise leaking from the signal line 12 to the semiconductor element 20 in the neighbor lane may be effectively reduced. Also, the ground metal 13 along the side 10c has the width $w_2$ smaller than the width $w_3$ of the signal line, which may further reduce high frequency components contained in the driving signal from leaking to the neighbor channel. Thus, the arrangement on the optical module 1A of the embodiment may effectively eliminate the crosstalk between the lanes. Preferably, the ground metal 13 with the width $w_2$ thereof narrower than the width $w_3$ of the signal line extends at least half of the side 10c. Also, an average width of the ground metal in the side 10d is greater than an average width of the other ground metal 13 in the side 10c, which may also effective reduce the crosstalk.

The optical transmitter apparatus 2B of the second embodiment mounts the die-capacitors 64 on the wiring substrate 63. However, each of the optical modules 1A may mount the die-capacitor 64 on the ground metal 13 thereon. Even such an arrangement of the optical modules 1A, each of the carrier 10 provide the side metal in at least one of the sides, 10c or 10d, thereof, that is, the side metals are provided between the signal lines 12, the crosstalk between the lanes may be effectively suppressed. Because the die-capacitor 64 is mounted on the carrier 10, a leaking path for high frequency components from the EA to the ground metal 13 through the die capacitor 64 may close within the optical module 1A, the crosstalk of the high frequency components to the neighbor lanes may be suppressed. When the die-capacitor 64 is mounted on the wiring substrate 63, the leaking path from the EA to the ground metal 13 includes the bonding wire 74 that connects the ground metal 63b on the wiring substrate 63 to the ground metal 13 on the carrier 10, which may possibly degrade the crosstalk between the lanes.

Figure 11:
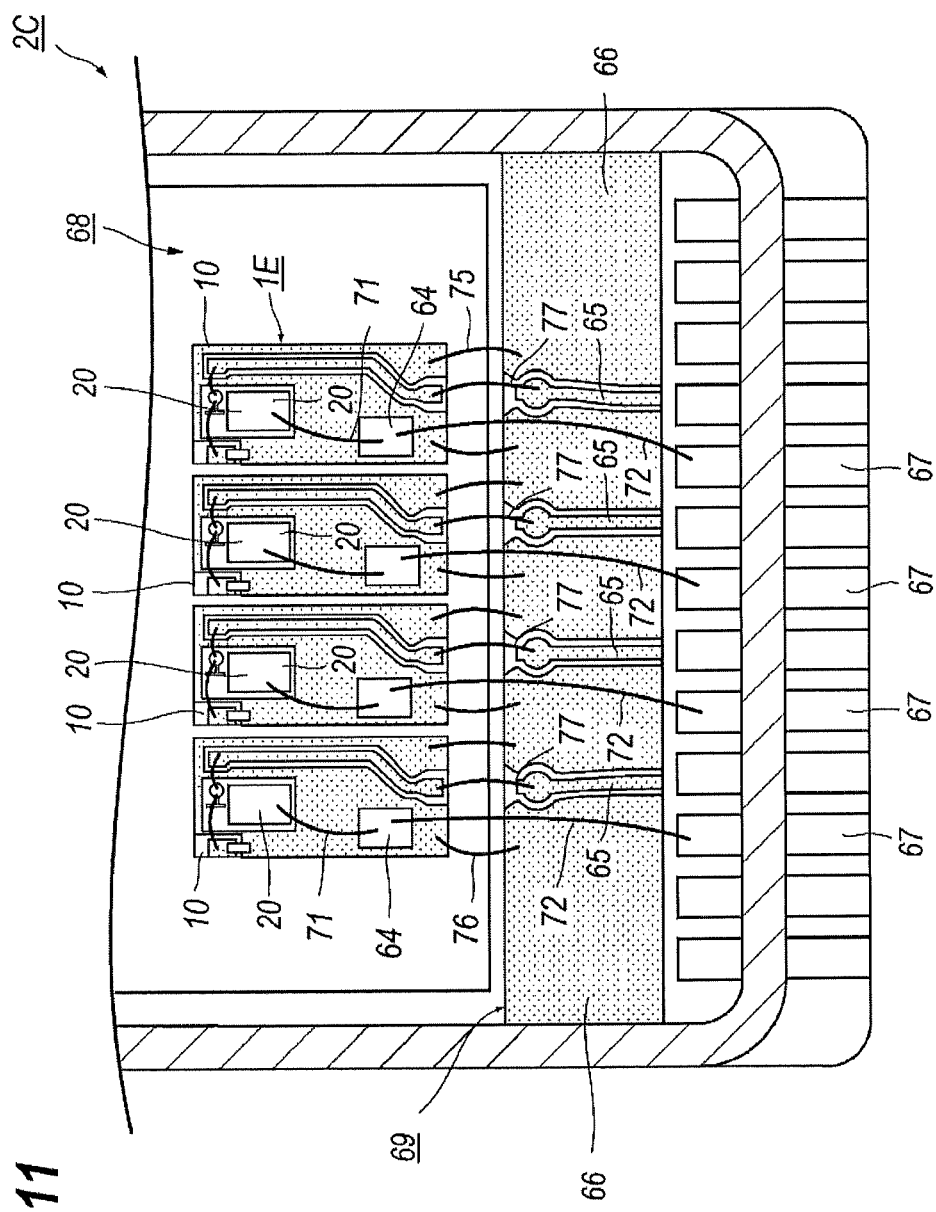
FIG. 11 magnifies a primary portion of an optical transmitter apparatus modified from the optical transmitter apparatus shown in FIG. 10.

Also, the optical transmitter apparatus 2B of the present embodiment provides the wiring substrate 63 between the feedthrough 69 and the optical modules 1A; and the wiring substrate 63 may show the function of the pitch conversion. That is, the pitch of the signal lines 63a in the side 63e facing the feedthrough 69 is set wider than the pitch of the signal lines 63a in the side 63d facing the optical modules 1A. However, the optical module 1B may remove the wiring substrate 63 by arranging an optical modules 1E in the pitch corresponding to the pitch of the lead terminals 67 for the driving signals, or setting the function of the pitch conversion in the signal lines 65 on the feedthrough 69; and mounting the die-capacitors 64 on the respective optical modules 1E. FIG. 11 shows such an arrangement of the optical transmitter apparatus 2C according to a modification of the optical transmitter apparatus 2B shown in FIG. 9. The optical transmitter apparatus 2C removes the wiring substrate 63 and disposes the optical modules 1E by a pitch substantially equal to the pitch of the lead terminals 67 in the first group for the driving signals. Because the pitches in the optical modules 1E and the lead terminals 67 are comparable to each other, the signal lines 65 on the feedthrough 69 extend substantially straight, which means that the lengths of the signal lines 65 become minimum such that the degradation in the shapes of the driving signals may be effectively reduced.

Also, the optical modules 1E shown in FIG. 11 have a feature that the bias pads 14 provided on the top of the carriers 10 disappear. The biases supplied to the LD are directly provided from the die-capacitors 64 through the bonding wires 71 without interposing the bias pads 14. This arrangement of the removal of the bias pads 14 enables that the side metal in the side 10d of the carrier extends from the edge 10f facing the feedthrough 69 to an end of the ground metal facing the terminator pad 15, that is, almost all of the side 10f is covered with the side metal. Thus, the side metal in the side 10f connected to the ground metal 13 may be put between the signal lines 12; the crosstalk between the lanes may be further eliminated. In addition, the arrangement of the modified optical transmitter apparatus 2C may form a wider space for mounting the optical coupling system in front of the optical modules 1E, where the optical coupling system optically couples the semiconductor elements 20 with the optical fiber set in the window 70. Also, such an arrangement may narrower a size of the top plate of the TEC 68 which may save the power consumption of the TEC 68.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An optical transmitter apparatus comprising:
an optical module that includes a semiconductor element and a carrier that mounts the semiconductor element thereon,
wherein the semiconductor element integrates a semiconductor laser diode (LD) with an electro-absorption modulator, and
wherein the carrier has a top surface, a back surface and two sides opposite to each other, the top surface implementing a co-planar line including a signal line and a ground metal having two portions sandwiching the signal line as leaving a preset gap therebetween, the signal line extending closer to one of the two sides, one of the portions of the ground metal disposed apart from the one of the two sides mounting the semiconductor element thereon; and
a package that encloses the optical module therein, the package providing a chassis ground,
wherein the back surface of the carrier provides a float metal that is electrically connected to the ground metal on the top surface but electrically isolated from the chassis ground.

2. The optical transmitter apparatus of claim 1,
further comprising a thermo-electric cooler having a top plate made of electrically insulating material, the top plate having a metal pad electrically isolated from the chassis ground but electrically in contact to the float metal of the carrier.

3. The optical transmitter apparatus of claim 1,
wherein the one of the sides of the carrier provides a side metal that electrically connects the float metal with the ground metal.

4. The optical transmitter apparatus of claim 3,
wherein the carrier has a thickness and a distance from the signal line to the side metal that are greater than the gap between the signal line and the ground metal.

5. The optical transmitter apparatus of claim 1,
wherein the ground metal has a via filled with a metal that electrically connects the float metal to the ground metal.

6. The optical transmitter apparatus of claim 5,
wherein the carrier has a thickness and a distance from the signal line to the via that are greater than the gap between the signal line and the ground metal.

7. The optical transmitter apparatus of claim 1,
wherein the another of the sides of the carrier provides another side metal that electrically connects the float metal to the ground metal.

8. The optical transmitter apparatus of claim 7,
wherein the carrier has a thickness and a distance from the signal line to the another of the sides that are greater than the preset gap between the signal line and the ground metal.

9. The optical transmitter apparatus of claim 1,
wherein the carrier has a rectangular shape having the two sides and two ends connecting the two sides,
wherein the co-planar line and the semiconductor element are arranged in side by side in one of the two ends, and
wherein the co-planar line is arranged in a center in another of the two ends.

10. The optical transmitter apparatus of claim 9,
wherein the carrier provides a side metal in a side of the another of the two ends, the side metal electrically connecting the float metal to the ground metal.

11. The optical transmitter apparatus of claim 10,
wherein the carrier has a thickness and a distance from the signal line to the side metal that are greater than the gap between the signal line and the ground metal.

12. The optical transmitter apparatus of claim 9,
further comprising a wiring substrate that includes another co-planar line having another signal line and another ground metal with two portions putting the another signal line therebetween, the signal line in the center of the another of the two ends of the carrier being wire-bonded to the another signal line on the wiring substrate, the two portions of the ground metal that arranged in respective sides of the signal line being wire-bonded to the two portions of the another ground metal on the wiring substrate.

13. The optical transmitter apparatus of claim 12,
wherein the wiring substrate provides a capacitor on one of the two portions of the another ground metal, and the carrier further provides a bias pad along the another of the two sides, and
wherein the capacitor is wire-bonded to the bias pad and the bias pad is wire-bonded to the semiconductor element.

14. The optical transmitter apparatus of claim 9,
wherein the carrier further provides a capacitor and a bias pad, the one of the two portions of the ground metal arranged closer to the another of the two sides mounting the capacitor and surrounding the bias pad along the another of the two sides, and
wherein the capacitor is wire-bonded to the bias pad, and the bias pad is wire-bonded to the semiconductor element.

15. The optical transmitter apparatus of claim 9,
wherein the carrier further provides a capacitor on the one of the two portions of the ground metal arranged closer to the another of the two sides, and
wherein the capacitor is wire-bonded to the semiconductor element.

16. An optical transmitter apparatus having a plurality of lanes outputting optical signals, the optical transmitter apparatus outputting a multiplexed optical signal that multiplexes the optical signals, the optical transmitter apparatus comprising:
a plurality of optical modules corresponding to the lanes, each of the optical modules includes,
a semiconductor element that integrates a semiconductor laser diode (LD) with an electro-absorption modulator, and
a carrier including a top surface, a back surface and two sides opposite to each other, the top surface implementing a co-planar line including a signal line and a ground metal having two portions sandwiching the signal line as leaving a preset gap therebetween, the signal line extending closer to the one of the sides, the ground metal in one of the portions thereof that is disposed apart from the one of the sides mounting the semiconductor element thereon;
a thermos-electric cooler (TEC) that mounts the optical modules thereon, the TEC having a top plate made of electrically insulating material, the top plate including a metal pad that mounts optical modules thereon; and
a package that encloses the semiconductor element and the optical module therein, the package providing a chassis ground,
wherein the back surfaces of the carriers provide float metals electrically connected to the ground metals on the respective top surfaces but electrically isolated from the chassis ground.

17. The optical transmitter apparatus of claim 16,
wherein at least one of the two sides of the one of the carrier provides a side metal that electrically connects the float metal to the ground metal, and
wherein the co-planar line on the one of the carrier and the co-planar line on another one of the carrier arranged next to the one of the carrier are divided by the side metal.

18. The optical transmitter apparatus of claim 16,
further comprising a wiring substrate that mounts co-planar lines each wire-bonded to the co-planar lines on the carriers,
wherein the package has lead terminals wire-bonded to the co-planar lines on the wiring substrate, the co-planar lines on the wiring substrate having a pitch in an end facing to the lead terminals and another pitch in another end facing the optical modules, and
wherein the pitch of the co-planar lines on the wiring substrate is aligned with a pitch of the lead terminals and the another pitch of the co-planar lines on the wiring substrate is aligned with a pitch of the co-planar lines on the carriers.

19. The optical transmitter apparatus of claim 18,
wherein the wiring substrate mounts capacitors on the ground metal thereof, the capacitors being wire-bonded to the respective semiconductor elements.

20. The optical transmitter apparatus of claim 16,
wherein the carriers each mounts a capacitor on the ground metal thereof, the capacitor being wire-bonded to the semiconductor element.

* * * * *